(12) United States Patent
Wu et al.

(10) Patent No.: US 11,037,905 B2
(45) Date of Patent: Jun. 15, 2021

(54) FORMATION OF STACKED VERTICAL TRANSPORT FIELD EFFECT TRANSISTORS

(71) Applicant: International Business Machines Corporation, Armonk, NY (US)

(72) Inventors: Heng Wu, Guilderland, NY (US); Gen Tsutsui, Glenmont, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/395,546

(22) Filed: Apr. 26, 2019

(65) Prior Publication Data

US 2020/0343222 A1    Oct. 29, 2020

(51) Int. Cl.
*H01L 25/065* (2006.01)
*H01L 21/762* (2006.01)
*H01L 25/07* (2006.01)
*H01L 25/00* (2006.01)

(52) U.S. Cl.
CPC .... *H01L 25/0657* (2013.01); *H01L 21/76251* (2013.01); *H01L 25/074* (2013.01); *H01L 25/50* (2013.01)

(58) Field of Classification Search
None
See application file for complete search history.

(56) References Cited

U.S. PATENT DOCUMENTS

| | | | |
|---|---|---|---|
| 5,612,563 A | 3/1997 | Fitch et al. | |
| 8,450,804 B2 * | 5/2013 | Sekar | H01L 27/0688 257/347 |
| 8,492,220 B2 | 7/2013 | Erickson et al. | |
| 9,177,890 B2 * | 11/2015 | Du | H01L 21/823814 |
| 9,680,473 B1 | 6/2017 | Anderson et al. | |
| 9,824,933 B1 | 11/2017 | Pawlak | |
| 9,997,413 B1 * | 6/2018 | Leobandung | H01L 21/823871 |
| 10,084,081 B2 | 9/2018 | Cheng et al. | |
| 10,177,046 B2 | 1/2019 | Cheng et al. | |
| 2013/0001701 A1 | 1/2013 | Christensen et al. | |
| 2013/0003434 A1 * | 1/2013 | Lue | H01L 27/0688 365/51 |
| 2018/0277442 A1 * | 9/2018 | Leobandung | H01L 27/0688 |
| 2019/0172751 A1 * | 6/2019 | Smith | H01L 21/823807 |
| 2020/0035691 A1 * | 1/2020 | Reznicek | H01L 29/105 |
| 2020/0144264 A1 * | 5/2020 | Li | H01L 27/0924 |
| 2020/0273755 A1 * | 8/2020 | Wu | H01L 27/088 |

* cited by examiner

*Primary Examiner* — Long Pham
(74) *Attorney, Agent, or Firm* — Fleit Intellectual Property Law; Thomas S. Grzesik

(57) ABSTRACT

A semiconductor device structure and method for fabricating the same. The semiconductor device structure includes a first vertical transport field effect transistor (VTFET) comprising a first semiconductor fin and a second VTFET stacked on the first VTFET. The second VTFET includes a second semiconductor fin that is separate and distinct from the first semiconductor fin. At least one insulating layer is disposed on a top surface of the first VTFET. The second VTFET is disposed on the at least one insulating layer. The method includes forming a first vertical VTFET on a first substrate and bonding a second substrate to and on top of the first VTFET. A second VTFET is formed on the second substrate.

12 Claims, 14 Drawing Sheets

FORMATION OF STACKED VERTICAL TRANSPORT FIELD EFFECT TRANSISTORS

BACKGROUND OF THE INVENTION

The present invention generally relates to the field of semiconductors, and more particularly relates to vertical field effect transistors.

Vertical transport field effect transistors (VTFETs or VFETs) are becoming viable device options for semiconductor devices, for example, complementary metal oxide semiconductor (CMOS) devices, beyond 5 nanometer (nm) node. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to extend the product value proposition beyond conventional plateaus and address the limitations of horizontal device architectures by, for example, decoupling of gate length from the contact gate pitch. Vertical transistors may provide higher density scaling and allow for relaxed gate lengths to better control device electrostatics, without sacrificing the gate contact pitch size.

SUMMARY OF THE INVENTION

In one embodiment, a method for forming a stacked semiconductor device structure comprises at least forming a first vertical transport field effect transistor (VTFET) on a first substrate and bonding a second substrate to and on top of the first VTFET. A second VTFET is formed on the second substrate.

In another embodiment, a semiconductor device structure comprises a first vertical transport field effect transistor (VTFET) comprising a first semiconductor fin and a second VTFET stacked on the first VTFET. The second VTFET comprises a second semiconductor fin that is separate and distinct from the first semiconductor fin. At least one insulating layer is formed on a top surface of the first VTFET. The second VTFET is formed on the at least one insulating layer.

In a further embodiment, an integrated circuit comprises a stacked vertical transport field effect transistor (VTFET) device. The stacked VTFET device comprises a first vertical transport field effect transistor (VTFET) comprising a first semiconductor fin and a second VTFET stacked on the first VTFET. The second VTFET comprises a second semiconductor fin that is separate and distinct from the first semiconductor fin. At least one insulating layer is formed on a top surface of the first VTFET. The second VTFET is formed on the at least one insulating layer.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
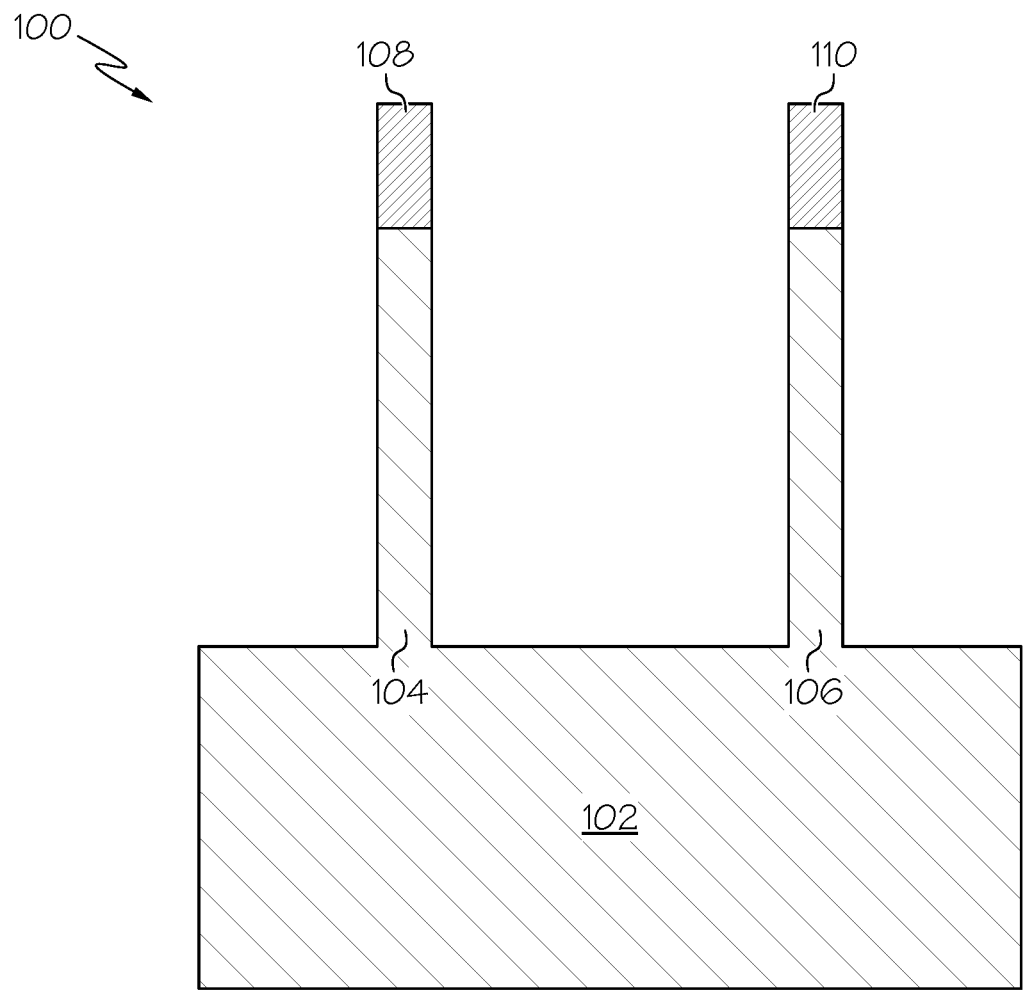
FIG. 1 is a cross-sectional view of a semiconductor device structure after a plurality of fins have been formed on a substrate according to one embodiment of the present invention.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET), and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

Deposition may be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal may be any process that removes material from the wafer; examples include etch processes (either wet or dry) and chemical-mechanical planarization (CMP).

Patterning refers to the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed by plasma ashing.

Modification of electrical properties has historically entailed doping transistor sources and drains (originally by diffusion furnaces and later by ion implantation). These doping processes are followed by furnace annealing or, in advanced devices, by rapid thermal annealing (RTA); annealing serves to activate the implanted dopants. Modification of electrical properties now also extends to the reduction of a material's dielectric constant in low-k insulators trench exposure to ultraviolet light in UV processing (UVP). Modification is frequently achieved by oxidation, which can be carried out to create semiconductor-insulator junctions, such as in the local oxidation of silicon (LOCOS) to fabricate metal oxide field effect transistors.

VTFET MOSFET is being pursued as a viable technology beyond the 5 nm node. Stacked VTFETs may be utilized to further reduce the area of the device enabling denser circuit layout. Conventional approaches for forming stacked VTFETs generally require very tall fin formation within a fin height of greater than 150 nm, which may cause problem such as fin bending and other undesirable loading effects. However, embodiments of the present invention overcome these and other problems by forming the vertical fin channel of stacked n-VTFETs and p-VTFETs sequentially. The sequentially fabrication of the channels greatly relaxes the RIE/fin height requirement for the process flow. The stacked vertical transistors enable much higher transistor integration density. The use of wafer bonding post bottom layer of transistor formation simplifies the process of stacked transistors due to that the two layer of transistors are formed separately on different Si layers.

FIGS. 1-13 illustrate various processes for forming stacked VTFETs according to various embodiments of the present invention. FIG. 1 shows a semiconductor device structure 100 at a given point in the fabrication process. For example, FIG. 1 shows a substrate 102; one or more fin structures 104, 106; and a hard mask 108, 110 formed on and in contact with a top surface of each fin structure 104, 106. In some embodiments, the substrate 102 is a bulk substrate. The structure 100 may comprise one or more semiconductor fins 104, 106 for PFET devices, NFET devices, or a combination of both. In one embodiment, the substrate 102 comprises entirely of a semiconductor material. The fin critical dimension may range from 4 nm to 10 nm, the fin height may range from 20 nm to 60 nm, and the fin length may range from 30 nm to 200 nm although other dimensions are applicable as well.

The substrate 102 may comprise a single crystalline semiconductor material or a polycrystalline material. In another embodiment, the substrate 102 may include an elemental semiconductor material such as silicon (Si) or germanium (Ge), a semiconductor material primarily composed of Group IV elements such as a silicon-germanium alloy or a silicon-carbon alloy, a III-V compound semiconductor material, a II-VI compound semiconductor material, or an organic semiconductor material.

The substrate 102 may comprise undoped single crystalline silicon or single crystalline silicon doped with p-type dopant atoms or n-type dopant atoms. Examples of materials for the substrate 102 include, but are not limited to, silicon, germanium, diamond, silicon germanium, silicon carbide, gallium arsenic, indium arsenide, indium phosphide, silicon germanium carbide, gallium arsenic phosphide, gallium indium phosphide, combinations of these, or any other suitable semiconductor material(s) in which fins for multi-gate devices can be formed. In other embodiments, the substrate 102 is formed on and in contact with a handle substrate or an insulating layer disposed in contact with a handle substrate. In this embodiment, the handle substrate includes similar materials to those discussed above.

Doping of the substrate 102 (or other semiconductor layer from which the fins 104, 106 are formed) may be performed using, for example, ion implantation, or annealing if not using an epitaxial process. In a non-limiting illustrative example, the doping utilizes, for example, arsenic (As) or phosphorous (P) for n-type device, and boron (B) for a p-type device, at concentrations in the general range of, for example, e20/cm$^3$.

In other embodiments, the substrate 102 is a silicon-on-insulator (SOI) substrate. In this example, an optional dielectric layer (e.g., a BOX layer or oxide layer) overlies the substrate, and the fin structures 104, 106 are formed on and in contact with the dielectric layer. The optional dielectric layer may be formed from any of several dielectric materials. Non-limiting examples include, for example, oxides, nitrides and oxynitrides of silicon. The dielectric layer may also include oxides, nitrides and oxynitrides of elements other than silicon. In addition, the dielectric layer may include crystalline or non-crystalline dielectric material. Moreover, the dielectric layer may be formed using any of several methods. Non-limiting examples include ion implantation methods, thermal or plasma oxidation or nitridation methods, chemical vapor deposition methods and physical vapor deposition methods. The dielectric layer may include a thickness ranging from about 5 nm to about 200 nm. In one embodiment, the dielectric layer may be about 25 nm thick. In an embodiment where the fins structures are formed on an SOI substrate, the fin structures and the substrate can be made of the same or different materials.

In an SOI embodiment, the semiconductor material/layer from which the fin structures 104, 106 are fabricated may be formed utilizing various methods such as a layer transfer process including a bonding step, or an implantation process such as SIMOX (Separation by IMplantation of OXygen). This semiconductor material/layer may be undoped or doped with either p-type or n-type dopants through ion implantation, plasma doping, or gas phase doping. P-type transistors are produced by doping the semiconductor material/layer with elements from group III of the periodic table (e.g., boron, aluminum, gallium, or indium). As an example, the dopant can be boron in a concentration ranging from 1×10E18 atoms/cm3 to 2×10E21 atoms/cm3. N-type transistors are produced by doping the semiconductor material/layer with elements from group V of the periodic table (e.g., phosphorus, antimony, or arsenic).

The semiconductor fin 104, 106 may be formed by forming an etch-stop hard mask onto the substrate 102 (or semiconductor layer) through, for example, deposition. The etch-stop hard mask may be made of, for example, silicon oxide, silicon oxynitride, silicon carbide, silicon oxycarbide, silicon nitride, titanium nitride, tetraethyl orthosilicate, a combination thereof, and/or other materials suitable in providing etch-stop function. The semiconductor fin 104, 106 is subsequently formed or etched out of the substrate 102 (or the semiconductor layer) through a process involving masking, using industry-standard lithographic techniques, and directionally etching (e.g., RIE) the etch-stop capping layer and underneath semiconductor layer (or substrate 102). After the RIE etching process, the photo-resist mask used in the lithographic etching process may be removed, leaving the semiconductor fin 104, 106 and hard mask 108, 110. In some embodiments, there may be different pitches between two or more of the fin structures to define different devices. The semiconductor fin 104, 106 may have a height of 30-40 nm although other heights are applicable as well.

Figure 2:
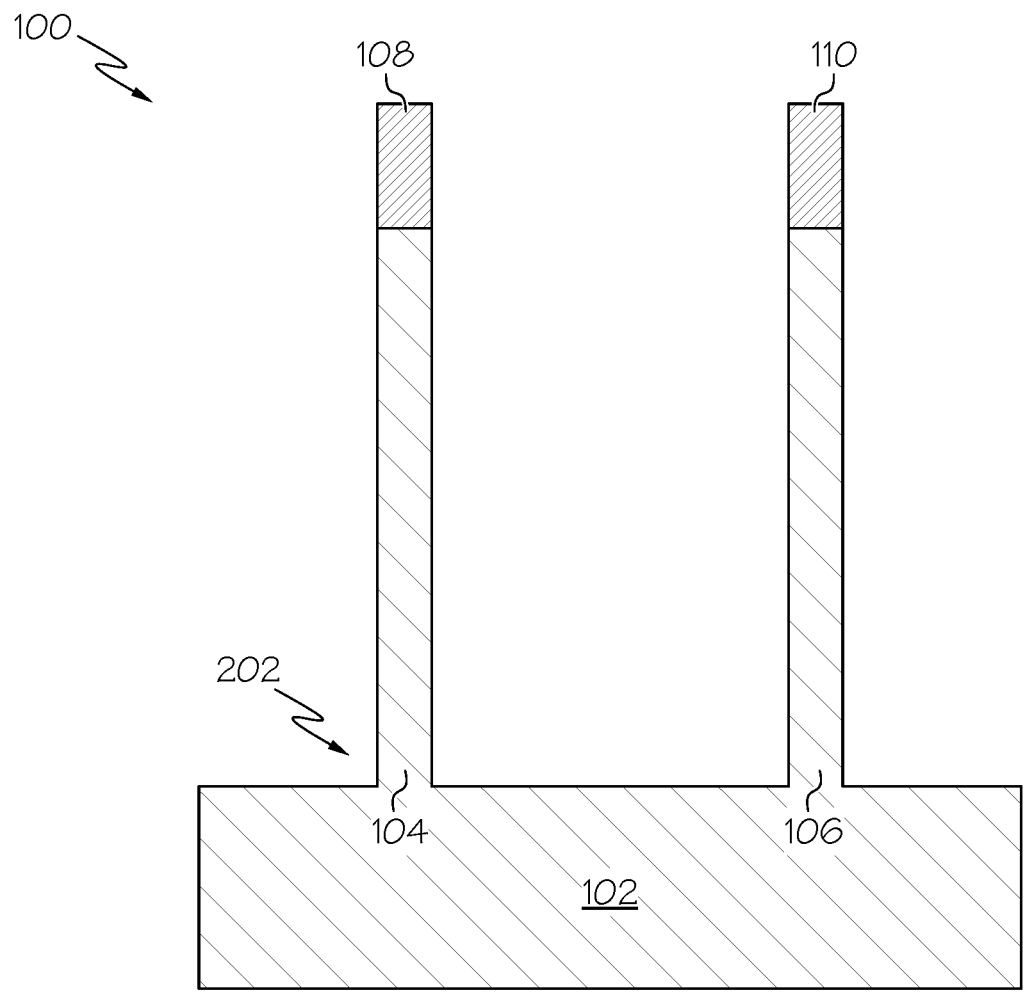
FIG. 2 is a cross-sectional view of the semiconductor device structure after the substrate has been recessed according to one embodiment of the present invention.
Figure 3:
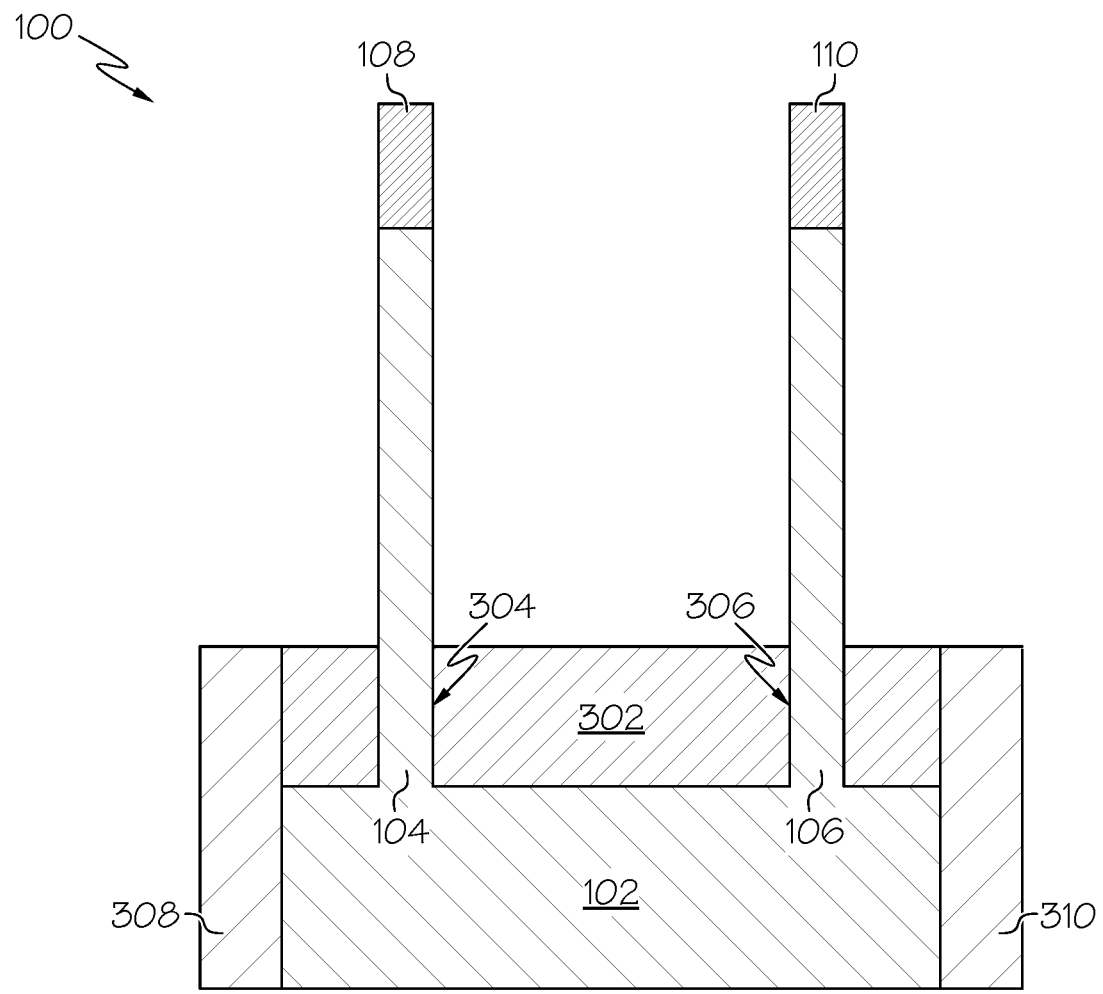
FIG. 3 is a cross-sectional view of the semiconductor device structure after a bottom source/drain has been formed according to one embodiment of the present invention.

The substrate 102 may then recessed to form a bottom source/drain recess 202 as shown in FIG. 2. The substrate 102 may be recessed using, for example, directional RIE. A lateral etch process may also be performed to trim the fin bottom. A bottom source/drain 302 may then be formed as shown in FIG. 3. The bottom source/drain layer 302 may either be a source layer or a drain layer and is formed in contact with the substrate 102 and exposed bottom portions 304, 306 of the fins 104, 106. A single bottom source/drain layer 302 (merged) may be formed for multiple fins 104, 106 or a separate bottom source/drain layer 302 may be formed for each fin.

Example materials for the bottom source/drain layer 302 include (but are not limited to) phosphorus doped silicon epitaxy for an NFET device and boron doped silicon germanium epitaxy for a PFET device. In one embodiment, the bottom source/drain layer 302 may have a thickness of about 10 nm to about 100 nm. However, other thicknesses are applicable as well. The bottom source/drain layer 302 may be doped with dopant atoms. The dopant atoms may be an n-type dopant (i.e., an element from Group V of the Periodic Table of Elements) or a p-type dopant (i.e., an element from Group III of the Periodic Table of Elements). Examples of n-type dopants for a group IV semiconductor include phosphorus, arsenic and antimony. Examples of p-type dopants for a group IV semiconductor include boron, aluminum, and gallium. Examples of n-type dopants for a III-V semiconductor include selenium, tellurium, silicon, and germanium. Examples of p-type dopants for a III-V semiconductor include beryllium, zinc, cadmium, silicon, and germanium.

In some embodiments, the bottom source/drain layer 302 may be formed by epitaxial growth of a semiconductor material. The terms "epitaxially growing", "epitaxial growth", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a carbon containing gas source, or a combination thereof. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof.

FIG. 3 also shows that one or more isolation regions 308, 310 such as shallow trench isolation regions may then be formed. For example, a flowable oxide may be deposited over the structure 100 and then a hard mask may be formed to define isolation trenches. The hard masks may be formed by, for example, depositing, and a suitable hard mask material, such as silicon nitride, onto the flowable oxide and then patterned using standard lithography and etching techniques. Trenches are then formed within the exposed oxide down into the substrate 102. Shallow trench isolation (STI) oxide is then deposited within the trench regions forming STI regions 308, 310, as shown in FIG. 3. The flowable oxide, mask, and excess STI oxide are removed via chemical-mechanical polishing (CMP), selective etching, and/or the like. FIG. 3 shows that the resulting STI regions 308, 310 may comprise a top surface that is co-planar with a top surface of the bottom source/drain layer 302.

Figure 4:
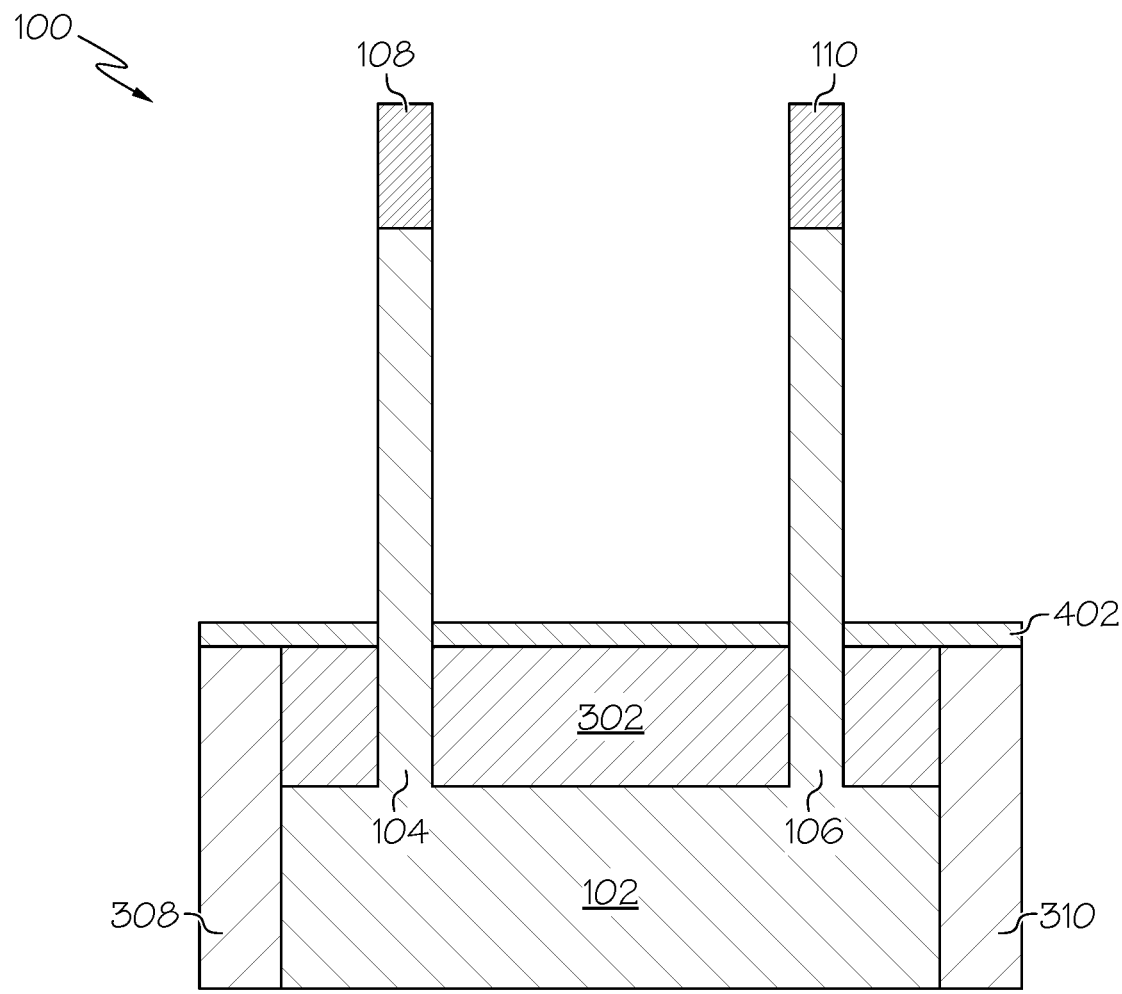
FIG. 4 is a cross-sectional view of the semiconductor device structure after a bottom spacer layer has been formed according to one embodiment of the present invention.

FIG. 4 shows that a bottom spacer layer 402 may be subsequently formed on and in contact with the bottom source/drain layer 302; sidewalls of the fins 104, 106; and a top surface of the isolation regions 308, 310. The bottom spacer layer 402 may include an insulating material (such as silicon oxide, silicon nitride, silicon oxynitride, or a combination of these) and is formed using any non-conformal deposition process such as, for example, high density plasma (HDP) and physical vapor deposition (PVD) and subsequent etching techniques. The deposited spacer material may then be subsequently etched to form the final spacer structure.

Figure 5:
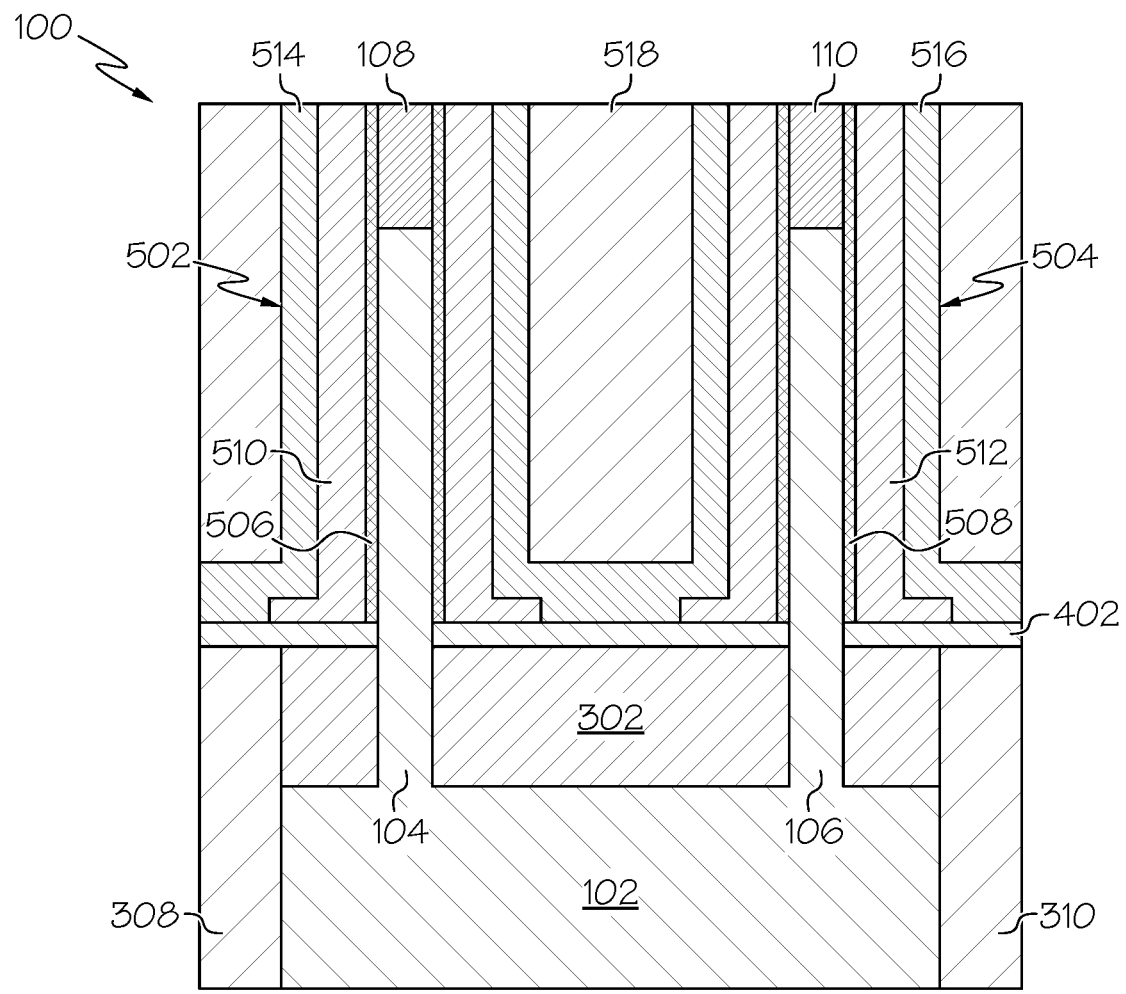
FIG. 5 is a cross-sectional view of the semiconductor device structure after a gate structure has been formed according to one embodiment of the present invention.

FIG. 5 shows that after formation of the bottom spacer layer 402, a gate structure 502, 504 may be formed on and in contact with each fin 104, 106. It should be noted that a single gate structure may be formed for multiple fins, or separate gate structures may be formed for each of the multiple fins. The gate structure 502, 504 may comprise and insulating layer 506, 508 formed in contact with and surrounding a portion of the fin sidewalls and a top surface of the bottom spacer layer 402. The insulating layer 506, 508 may be formed by depositing a thin conformal layer over the structure by, for example, CVD, PECVD, or ALD. In one embodiment, the insulating layer 506, 508 may be a high-k dielectric layer. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The insulating layer 506, 508 may further include dopants such as lanthanum or aluminum.

After formation of the insulating layer 506, 508, an annealing process may be performed to form bottom source/drain junctions within a portion of the fins 104, 106. In one or more embodiments, an annealing process may be conducted after the formation of the bottom source/drain layer 302 in order to push the bottom junctions further into the fins 104, 106. A thermal anneal process such as laser anneal, flash anneal, rapid thermal anneal (RTA), furnace anneal, or any suitable combination of those annealing techniques may be performed. In some embodiments, the junctions may have a height of, for example, 4 nm to 10 nm. Although other dimensions are applicable as well. The top surface of the bottom junctions may be below, above, or stop at the top surface of the bottom spacer layer 402.

The gate structure 502, 504 may further comprise one or more conductive gate (electrode) layers 510, 512 formed in contact with and surrounding the vertical sidewalls of the insulating layer 506, 508 and a top surface of the bottom spacer layer 402. In other embodiments, the conductive gate layers 510, 512 may be in contact with a top surface of insulating layer portions that are in contact with the bottom spacer layer 402. In one embodiment, the conductive gate layers 510, 512 may be formed by depositing one or more conductive materials over the structure. The insulating layer 506, 508 and conductive gate layers 510, 512 form a gate structure. If the structure comprises both PFET and NFET devices, PFET conductive materials may first be deposited. The PFET device may then be masked off and one or more NFET conductive materials are deposited over the entire structure. The masking layer is then removed from the PFET device. In other embodiments, the NFET device may be masked off during deposition of the PFET gate layers.

Examples of conductive gate materials include (but are not limited to) polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive gate material may further comprise dopants that are incorporated during or after deposition.

The conductive gate material may comprise multiple layers such as gate work function setting layer (work function metal) and/or a conductive gate layer. The work function metal be deposited employing CVD, sputtering, or plating. The work function metal layers may comprise one or more metals having a function suitable to tune the work function of NFETs or PFETs. In various embodiments, a work function layer may be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer may include multiple layers of work function materials, for example, a work function layer can be a TiN/TiC stack. The insulating layer 506, 508 and conductive gate layers 510, 512 may be conformally deposited on the bottom spacer layer 402 and on and around the fins 104, 106 including any hardmask formed on the fins 104, 106.

An encapsulation layer 514, 516 such as (but not limited to) silicon nitride may then formed over the structure using a conformal deposition process. During a subsequent top source/drain layer formation process, one or more etching processes may be performed to remove the encapsulation layer material from the top surface of gate structure 502, 504 and fin hard mask 108, 110. A dielectric layer 518 may then be formed over the structure 100. The dielectric layer 518, in one embodiment, may include SiO2, Si3N4, SiOxNy, SiC, SiCO, SiCOH, and SiCH compounds; one or more silicon-based materials with some or all of the Si replaced by Ge; carbon-doped oxides; inorganic oxides; inorganic polymers; hybrid polymers; organic polymers such as polyamides or SiLK™; other carbon-base materials; organo-inorganic materials such as spin-on glasses and silsesquioxane-based materials; and diamond-like carbon (DLC, also known as amorphous hydrogenated carbon, α-C:H). Planarization, for example, CMP may be performed to remove excess material from layer 518. The planarization may be performed down to the encapsulation layer 514, 416; gate structure 502, 504; and fin hard mask 108, 110.

Figure 6:
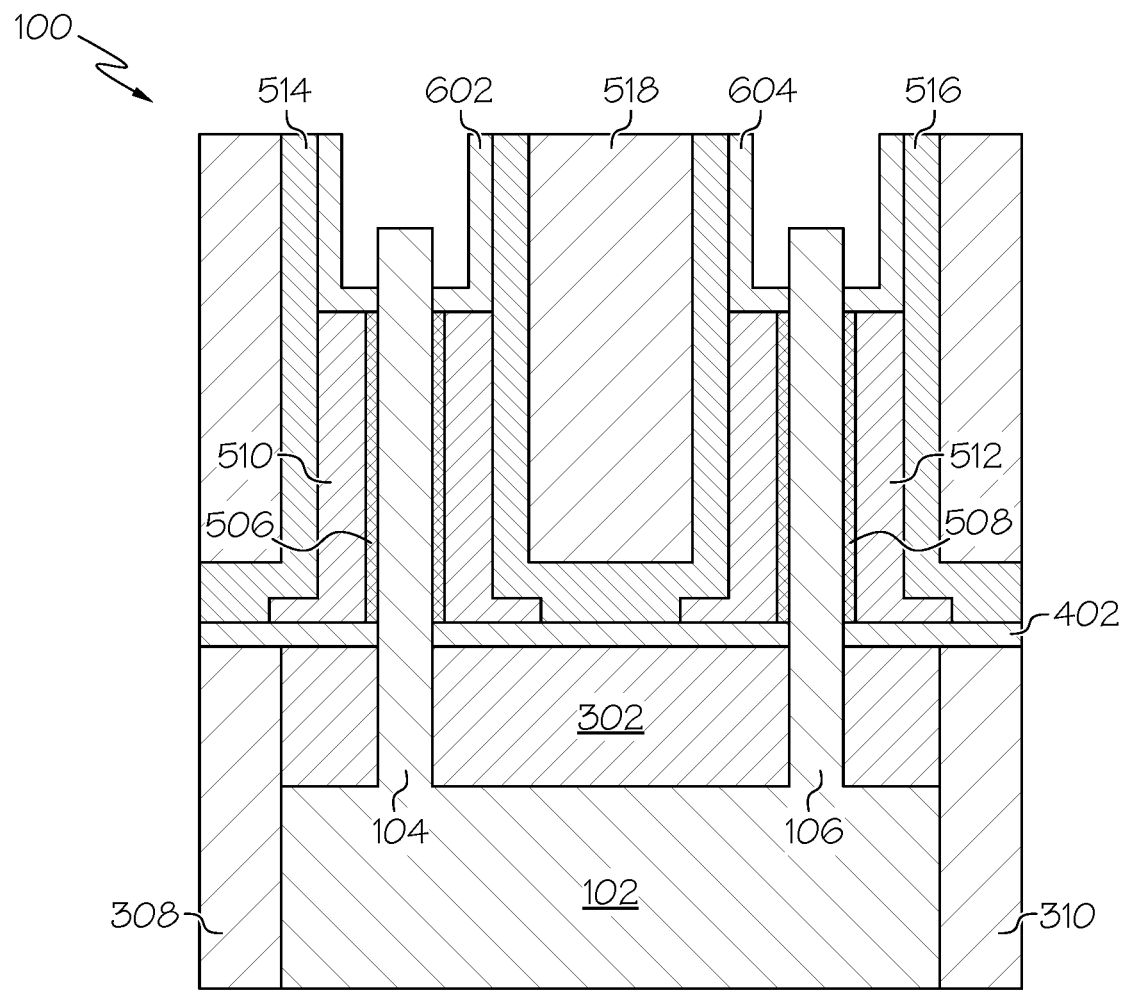
FIG. 6 is a cross-sectional view of the semiconductor device structure after a top spacer layer and encapsulation layer have been formed according to one embodiment of the present invention.

A top spacer 602, 604 may then be formed as shown in FIG. 6. For example, in one embodiment, the fin hard mask 108, 108 may be selectively removed by, for example, RIE which stops on the fin structures 104, 106. An isotropic etch may then be performed to recess the insulating layer 506, 508 and conductive gate layer 510, 512 of the gate structure 502, 504. These processes expose a top portion of the fin 104, 106. The top spacer 602, 604 may be formed on and in contact with inner sidewalls of the encapsulation layer 514, 516; the top surface of the conductive gate layers 510, 512; the top surface of the insulating layers 506, 508; and a portion of the sidewalls of the fins 104, 106. In some embodiments, the top surface of the spacer 602, 604 may be co-planar with or below the top surfaces of the fins 104, 106. In other embodiments, the top spacer 602, 604 forms a U-shape where vertical portions of the spacer do not contact the fins 104, 106 and extend above the top surface of the fins 104, 106. In this embodiment, the bottom surface of the spacer 602, 604 may be formed on and in contact with the top surface of the conductive gate layers 510, 512; the top surface of the insulating layers 506, 508; and a portion of the sidewalls of the fins 104, 106.

In one embodiment, the top spacer 602, 604 may comprise the same or different material as the bottom spacer layer 402. For example, the top spacer 602, 604 may comprise an insulating material (such as silicon oxide, silicon nitride, silicon oxynitride, or a combination of these) and can be formed using any conventional deposition process such as, for example, chemical vapor deposition (CVD) and subsequent etching techniques. The deposited spacer material is then subsequently etched to form the final spacer structure.

Figure 7:
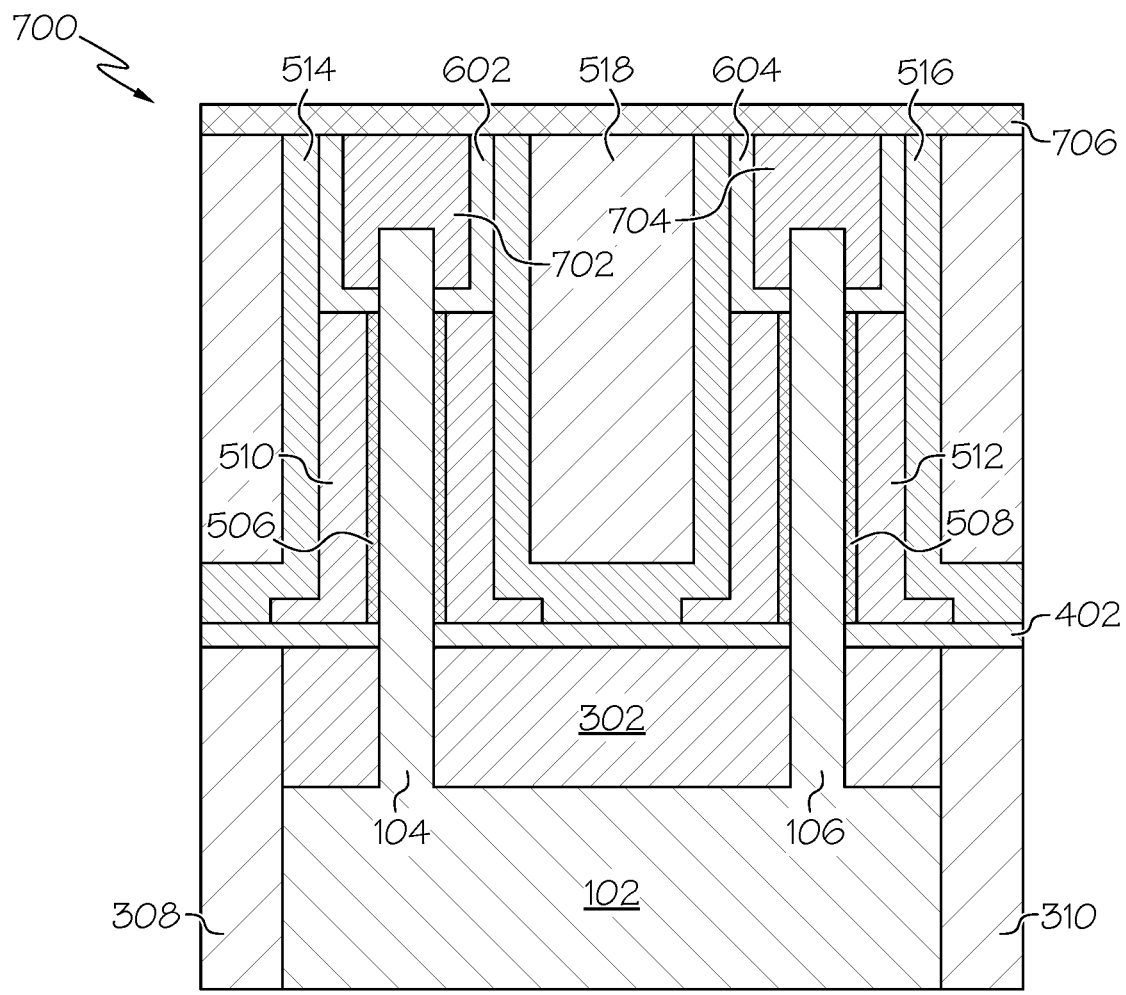
FIG. 7 is a cross-sectional view of the semiconductor device structure after a top source/drain layer, dielectric layer, and an insulating layer have been formed according to one embodiment of the present invention.

FIG. 7 shows that one or more top source/drains 702, 704 may then be formed in contact with at least the top portions of the fins 104, 106 in which source/drain junctions may have been formed. The top source/drains 702, 704 may be formed using an epitaxy process. For example, selective epitaxy may be used to grow material from the exposed top source/drain junctions to form the top source/drain layers 702, 704. The top source/drain layers 702, 704 may either be a source layer or a drain layer and may comprise in-situ doping (boron, in one embodiment for PFET and phosphorus, in one embodiment, for NFET). It should be noted that, according to one embodiment, the top source/drain layers 702, 704 may not contain any doping. Doping may be performed using any standard approach such as ion implantation. In particular, due to the slower growth rates on (111) orientated surface during the epitaxial growth so that faceted top source/drain layers 702, 704 are obtained.

As shown in FIG. 7, the top source/drain layers 702, 704 may fill the trench formed by the top spacer 602, 604. For example, the source/drain layers 702, 704 is formed on and in contact with a top surface of the bottom portion of the top spacer 602, 604; inner sidewalls of the vertical portions of the top spacer 602, 604; sidewalls of the fins 104, 106; and the top surface of the fins 104, 106. In one embodiment, the source/drain layers 702, 704 may be polished such that their top surface is co-planar with one or more of the insulating layer 506, 508; conductive gate layers 510, 512; encapsulation layers 514, 516; and dielectric layer 702. In some embodiments, the top source/drain layers 702, 704 may extend above the top spacers 602, 604. Also, the top source/drain layers 702, 704 may comprise angled sides. In one or more embodiments, the top source/drain layers 702, 704 comprise a diamond shape. The epitaxial growth of diamond shaped epitaxy is self-limiting to the outer <111> plane resulting in diamond outer periphery. It should be noted that, non-faceted epitaxy and/or multiple epitaxy steps can be used to form the top source/drain layers 702, 704 without limiting the scope of the present invention. It should also be noted that, in some embodiments, the top source/drain layers 702, 704 may be merged.

In one or more embodiments, an annealing process may be conducted after the formation of the top source/drain layers 702, 704 in order to push any top junctions further into the fins 104, 106. A thermal anneal process such as laser anneal, flash anneal, rapid thermal anneal (RTA), furnace anneal, or any suitable combination of those annealing techniques can be performed. In some embodiments, the junctions may have a height of, for example, 4 nm to 10 nm. Although other dimensions are applicable as well. The bottom surface of the top junctions may be above, below, or stop at the insulating layer 506, 508.

An additional insulating layer 706 may then be formed over the entire structure. The dielectric layer 706, in one embodiment, may include SiO2, Si3N4, SiOxNy, SiC, SiCO, SiCOH, and SiCH compounds; one or more silicon-based materials with some or all of the Si replaced by Ge; carbon-doped oxides; inorganic oxides; inorganic polymers; hybrid polymers; organic polymers such as polyamides or SiLK™; other carbon-base materials; organo-inorganic materials such as spin-on glasses and silsesquioxane-based materials; and diamond-like carbon (DLC, also known as amorphous hydrogenated carbon, α-C:H). Additional choices for the blanket dielectric include any of the aforementioned materials in porous form, or in a form that changes during processing to or from being porous and/or permeable to being non-porous and/or non-permeable.

Figure 8:
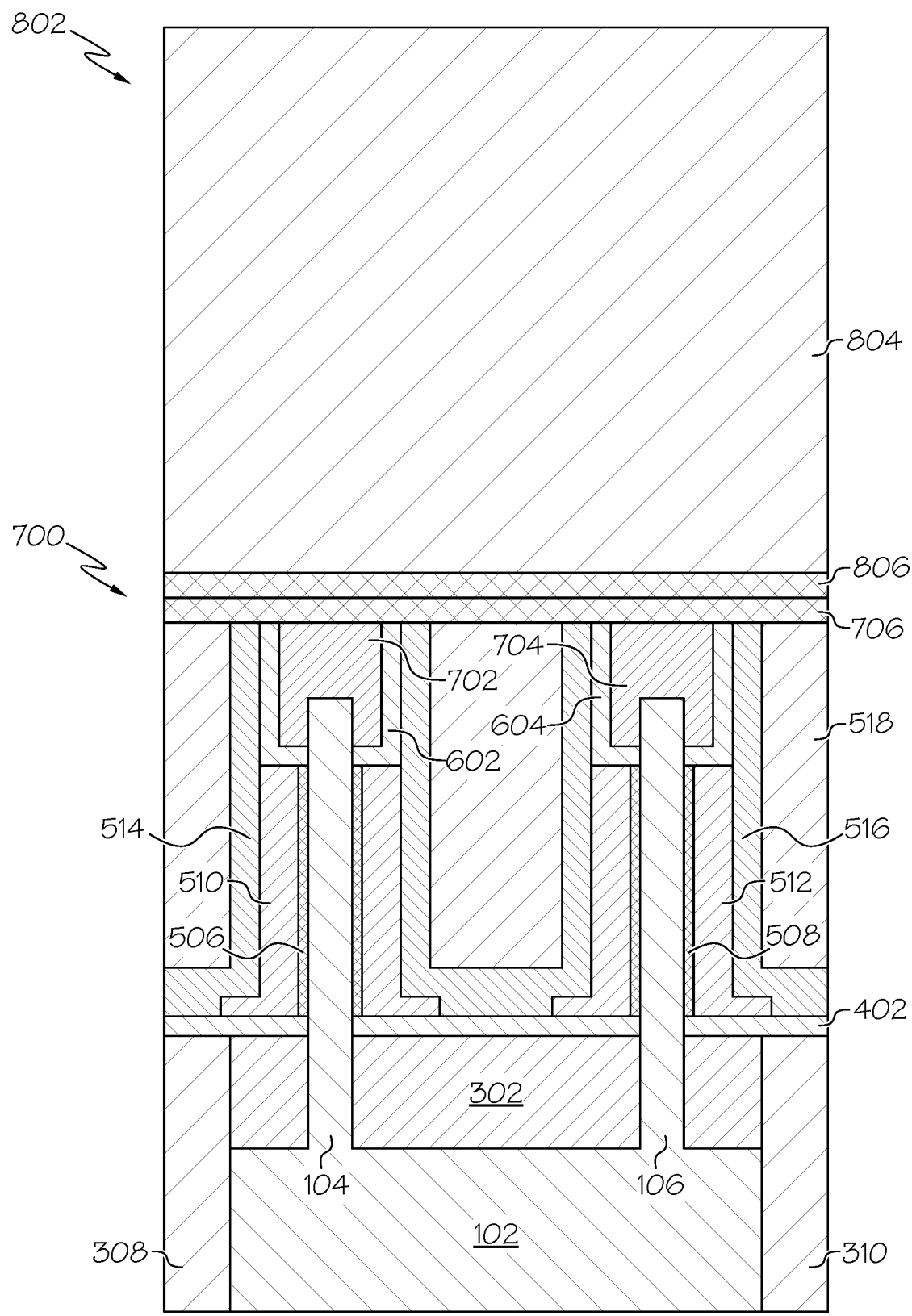
FIG. 8 is a cross-sectional view of the semiconductor device structure after a substrate comprising an insulating layer for a to VTFET has been flipped/rotated and bonded to the bottom VTFET structure of FIG. 7 according to one embodiment of the present invention.

The structure shown in FIG. 7 may be referred to as a first or bottom VEFET structure 700. It should be noted that embodiments of the present invention are not limited to the process discussed above for forming the VEFET structure 700 and may utilize one or more other fabrication processes as well. FIG. 8 shows that after the additional insulating layer 706 has been formed, a handle wafer 802 is bonded to the structure 100 of FIG. 7. The handle wafer 802 may comprise a substrate 804 similar to the substrate of the first VTFET structure 700 discussed above with respect to FIGS. 1-7. The handle wafer 802 may further comprise an insulating layer 806 similar to the insulating layer 706 of the first VTFET structure 100. After the handle wafer 802 has been formed, it may be flipped/rotated and subsequently bonded to the first VTFET structure 700. For example, FIG. 8 shows the insulating layer 806 of the handle wafer 802 being bonded to the insulating layer 706 of the first VTFET structure 700. Any bonding technique may be utilized to bond the insulating layer 806 of the handle wafer 802 to the insulating layer 706 of the first VTFET structure 700.

Figure 9:
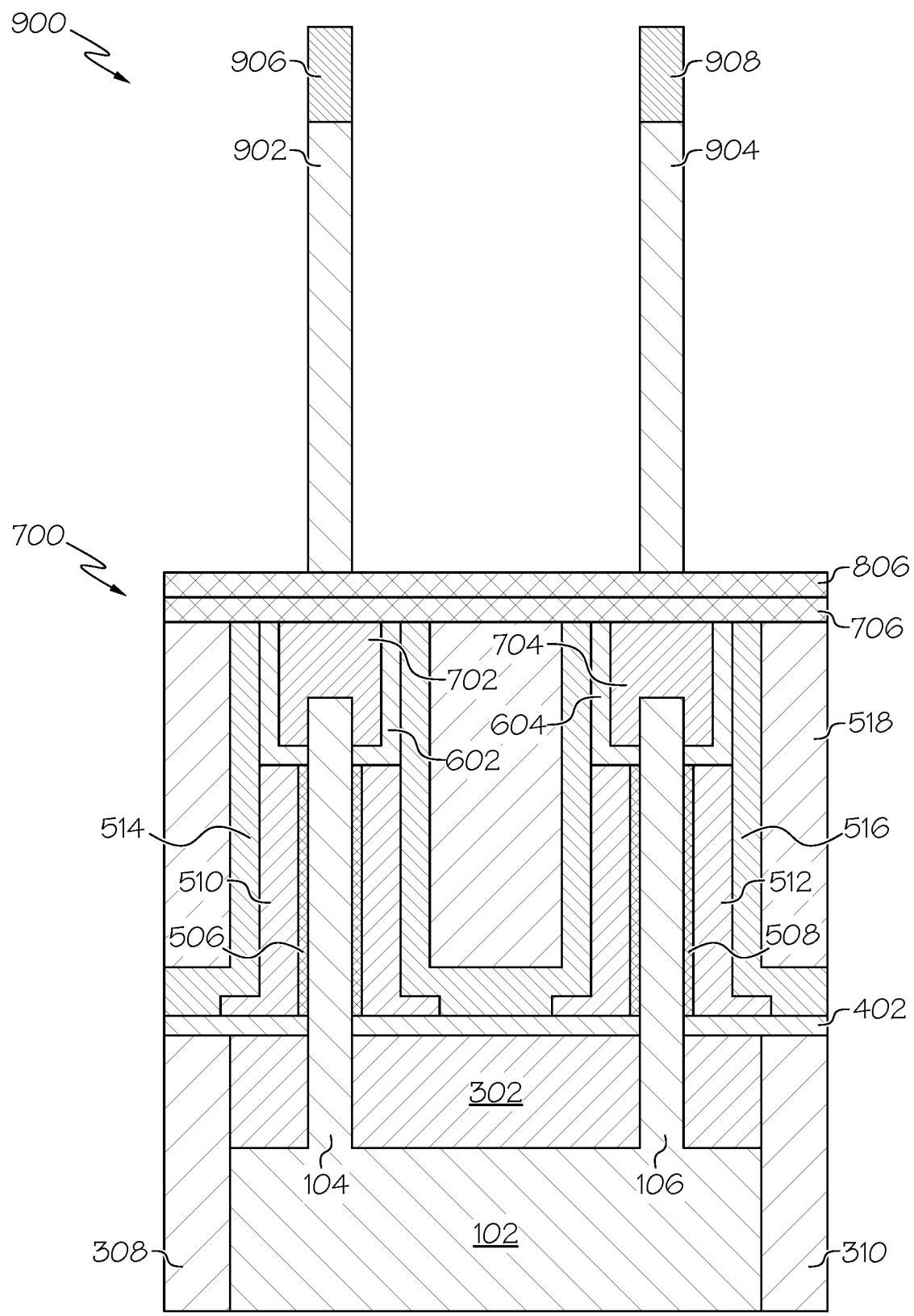
FIG. 9 is a cross-sectional view of a semiconductor device structure after a plurality of fins have been formed for the top VTFET according to one embodiment of the present invention.
Figure 10:
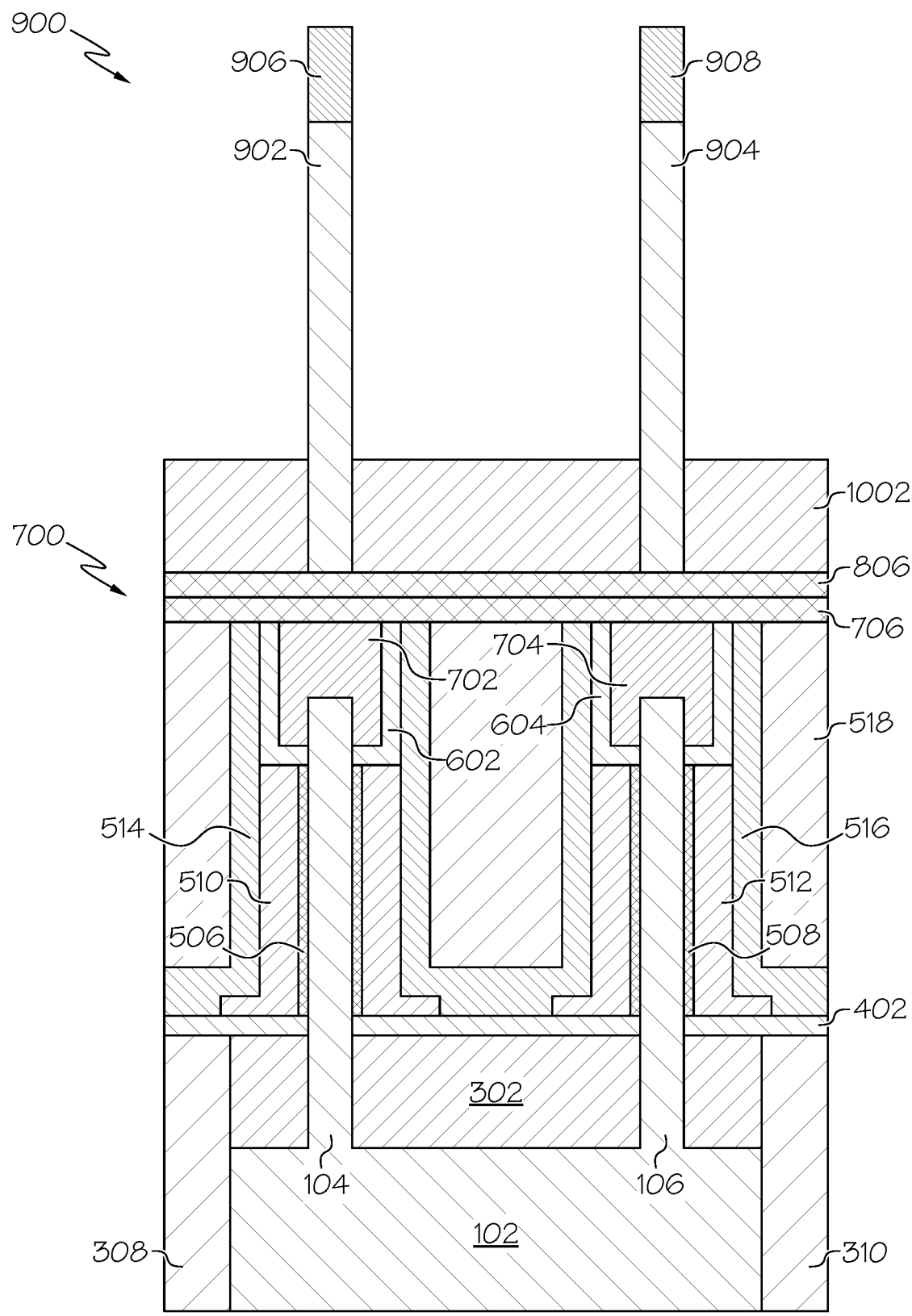
FIG. 10 is a cross-sectional view of the semiconductor device structure after a bottom source/drain has been formed for the top VTFET according to one embodiment of the present invention.

The substrate 804 of the handle wafer 802 may be polished and thinned down, and then patterned to form one or more fins 902, 904 for a second VTFET structure 900 as shown in FIG. 9. The fins 902, 904 may be for PFET devices, NFET devices, or a combination of both. The fins 902, 904 may be formed by utilizing a process similar to that discussed above with respect to FIG. 1. The fins 902, 904 may comprise hard masks 906, 908. A bottom source/drain 1002 may then be formed as shown in FIG. 10. The bottom source/drain layer 1002 may either be a source layer or a drain layer and is formed in contact with the insulating layer 806 and exposed bottom portions of the fins 902, 904. The bottom source/drain 1002 may comprise one or more materials and may be formed by one or more processes similar to those discussed above with respect to FIG. 3. A single bottom source/drain layer 1002 (merged) may be formed for multiple fins 902, 904 or a separate bottom source/drain layer 1002 may be formed for each fin.

Figure 11:
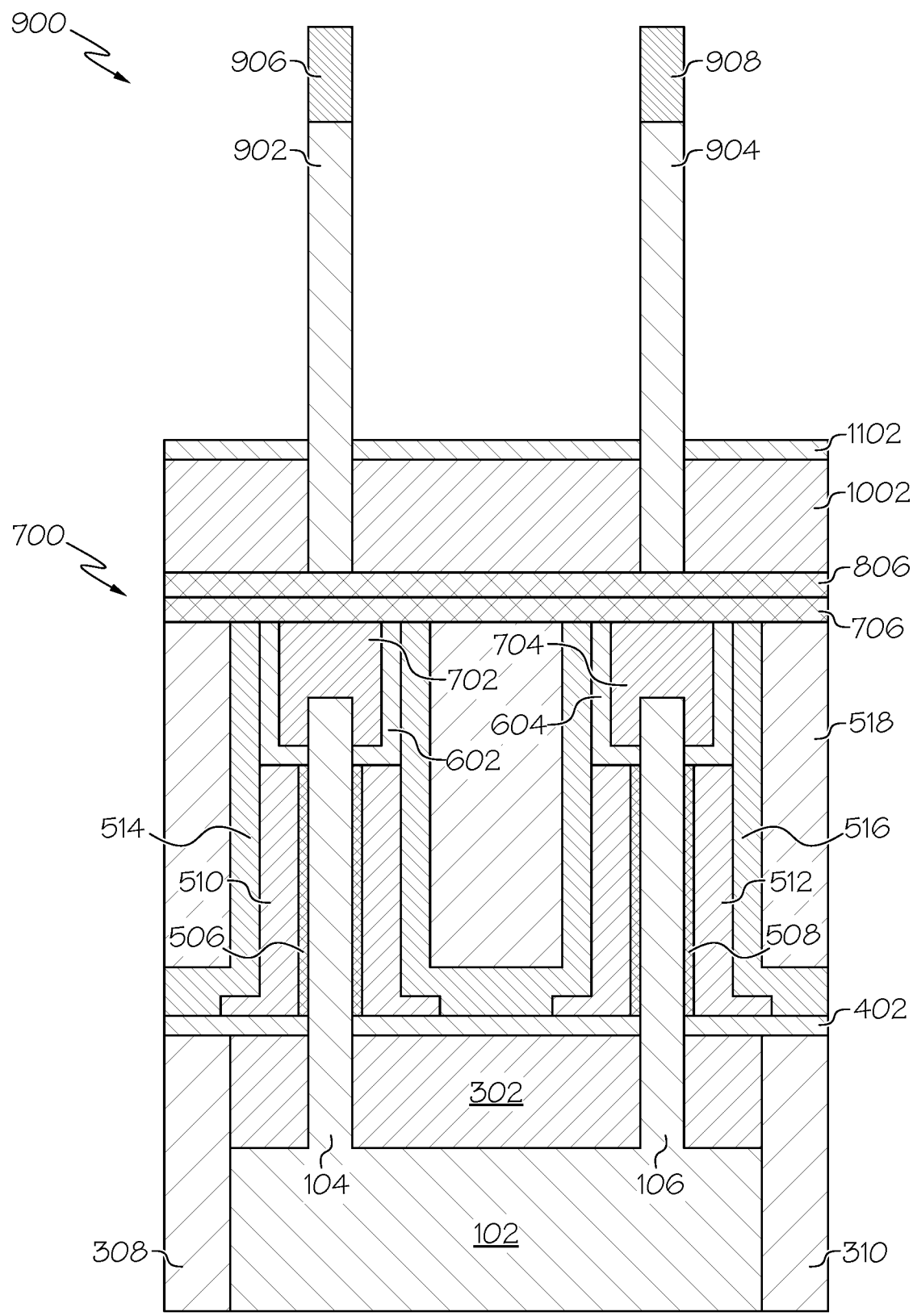
FIG. 11 is a cross-sectional view of the semiconductor device structure after a bottom spacer layer has been formed for the top VTFET according to one embodiment of the present invention.
Figure 12:
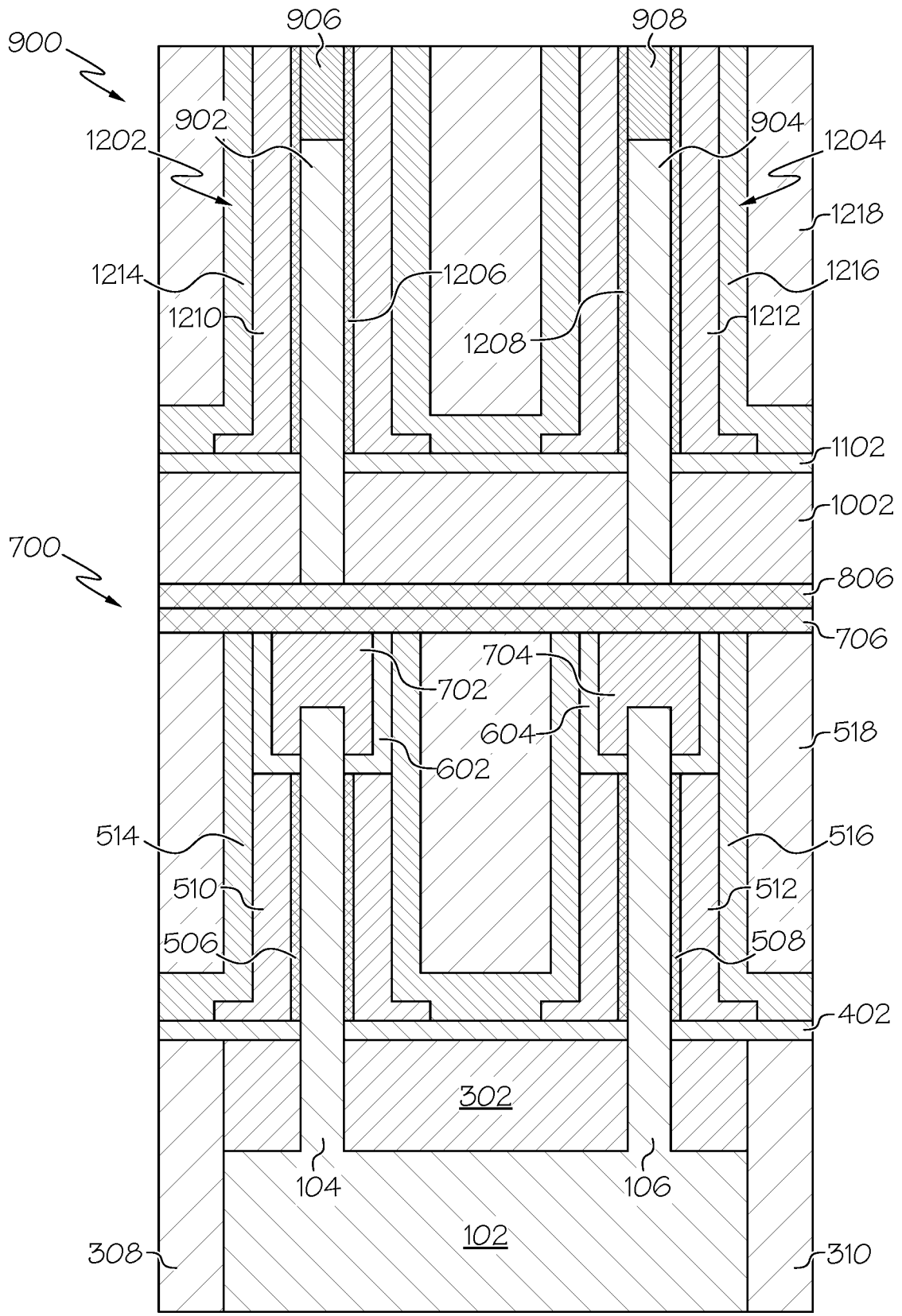
FIG. 12 is a cross-sectional view of the semiconductor device structure after a gate structure has been formed for the top VTFET according to one embodiment of the present invention.

FIG. 11 shows that a bottom spacer layer 1102 may be subsequently formed on and in contact with at least the bottom source/drain layer 1002; and sidewalls of the fins 902, 904. The bottom spacer layer 1102 may comprise one or more materials and may be formed by one or more processes similar to those discussed above with respect to FIG. 4. FIG. 12 shows that once the bottom spacer layer 1102 has been formed, a gate structure 1202, 1204 comprising an insulating layer 1206, 1208 and a gate conductor (electrode) 1210, 1212 may then be formed on and in contact with each fin 902, 904.

For example, FIG. 12 shows that the insulating layer 1206, 1208 is formed in contact with and surrounding a portion of the fin sidewalls and further in contact with a top surface of the bottom spacer layer 1102. The insulating layers 1206, 1208 may comprise one or more materials and may be formed by one or more processes similar to those discussed above with respect to FIG. 5. The conductive gate layers 1210, 1212 may be formed in contact with and surrounding the vertical sidewalls of the insulating layer 1206, 1208 and a top surface of the bottom spacer layer 1102. In other embodiments, the conductive gate layers 1210, 1212 may be in contact with a top surface of insulating layer portions that are in contact with the bottom spacer layer 1102. The conductive gate layers 1210, 1212 may comprise one or more materials and may be formed by one or more processes similar to those discussed above with respect to FIG. 5. It should be noted, that in one embodiment, after formation of the insulating layer 1206, 1208, an annealing process may be performed to form bottom source/drain junctions within a portion of the fins 902, 904 similar to that discussed above with respect to FIG. 5.

Figure 13:
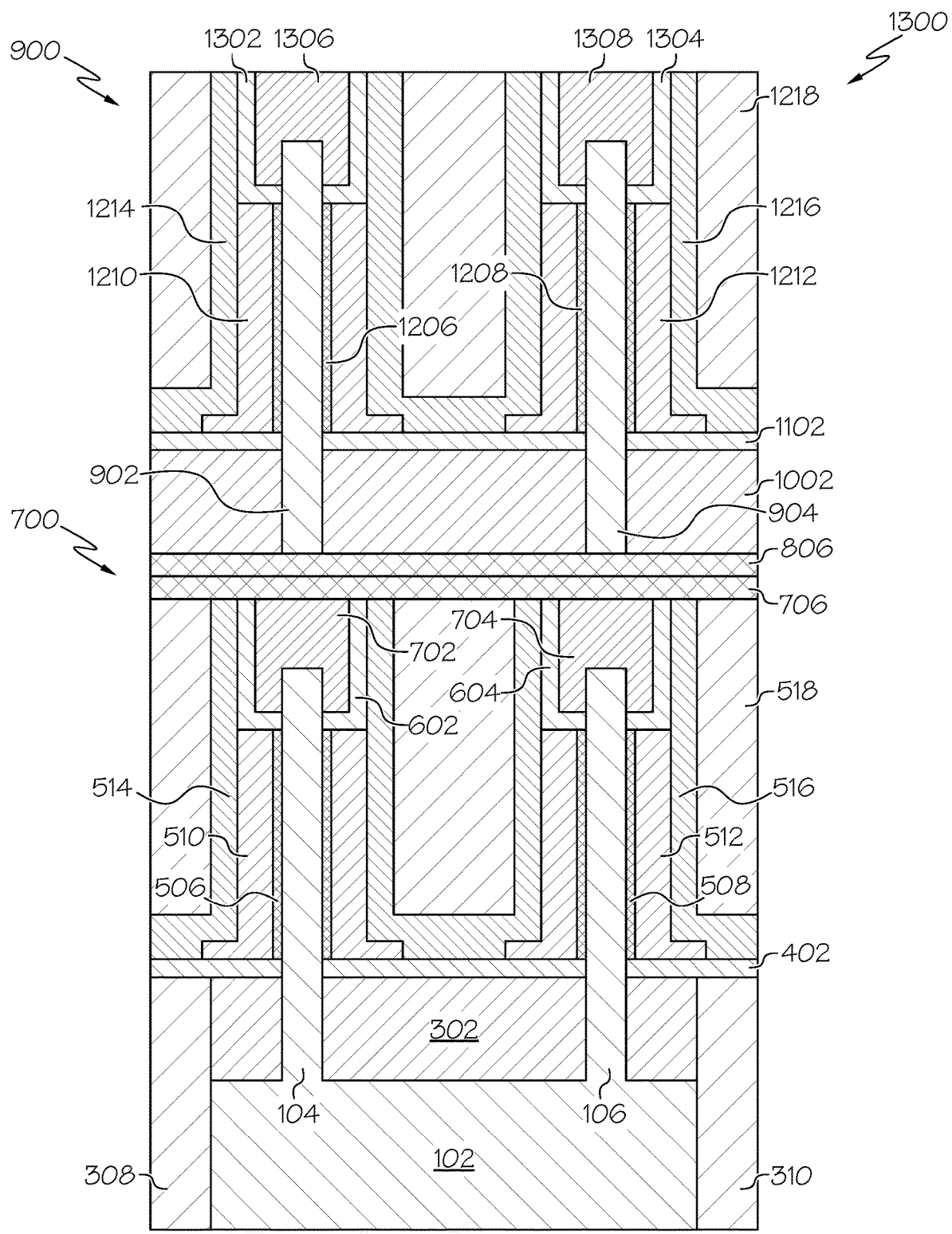
FIG. 13 is a cross-sectional view of the semiconductor device structure after an encapsulation layer, top spacer layer, top source/drain layer, and a dielectric layer have been formed for the top VTFET according to one embodiment of the present invention.

FIG. 12 further shows that an encapsulation layer 1214, 1216 and dielectric layer 1218 may be formed after the gate structure(s) 1202, 1204 similar to that discussed above with respect to FIG. 5. FIG. 13 shows that after the encapsulation layer(s) 1214, 1216 and dielectric layer 1218 have been formed, the fin hard masks 906, 908 may be removed and the gate structure(s) 1202, 1204 recessed. A top spacer layer 1302, 1304; and top source/drains 1306, 1308 may be formed similar to the corresponding components discussed above with respect to FIG. 6. A subsequent dielectric layer 1314 (not shown) may then be formed over the structure 900 similar to dielectric layer 702 of FIG. 7. The resulting structure 1300 is a stacked VTFET comprising one or more bottom VTFETs 700 and one or more top VTFETs 900 stacked on top of the bottom VTFET(s) 700 and insulated from each other by the insulating layer(s) 706, 806. The one or more bottom VTFETs 700 may comprise nFET or pFET devices and the one or more top VTFETs 900 may also comprise may comprise nFET or pFET devices. The stack 1300 of the first VTFET(s) 700 and the second VTFET(s) 900 may thus be n-type FET/p-type FET, n-type FET/n-type FET, p-type FET/p-type FET or p-type FET/n-type FET.

Figure 14:
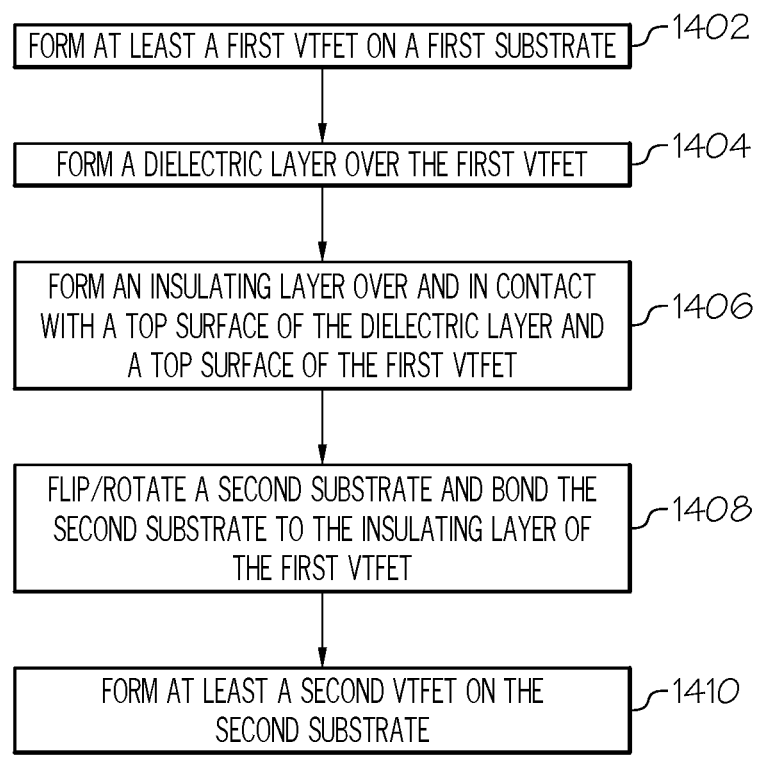
FIG. 14 is an operational flow diagram illustrating one example of a process for forming VTFETs according to one embodiment of the present invention.

FIG. 14 is an operational flow diagram illustrating one example of a process for forming stacked VTFETs. It should be noted that each of the steps shown in FIG. 14 has been discussed in greater detail above with respect to FIGS. 1 to 13. At least a first VTFET is formed on a first substrate, at step 1402. A dielectric layer is formed over the first VTFET and polished/planarized down, at step 1404. An insulating layer is formed over and in contact with a top surface of the dielectric layer and a top surface of the first VTFET, at step 1406. A second substrate is flipped/rotated and bonded to the insulating layer of the first VTFET, at step 1408. At least a second VTFET is formed on the second substrate, at step 1410.

Although specific embodiments have been taught, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also note that these embodiments are only examples of the many advantageous uses of the innovative teachings herein. In general, statements made in the specification of the present application do not necessarily limit any of the various claimed embodiments. Moreover, some statements may apply to some inventive features but not to others.

What is claimed is:

1. A semiconductor device structure comprising at least:
 a first vertical transport field effect transistor (VTFET) comprising a first semiconductor fin;
 a second VTFET stacked on the first VTFET and comprising a second semiconductor fin that is separate and distinct from the first semiconductor fin; and
 at least one insulating layer formed on a top surface of the first VTFET, wherein the second VTFET is formed on the at least one insulating layer, and wherein the first semiconductor fin is insulated from the second semiconductor fin by the at least one insulating layer.

2. The semiconductor device structure of claim 1, wherein the first VTFET and the second VTFET comprise one of a same doping type or a different doping type.

3. The semiconductor device structure of claim 1, wherein first VTFET comprises a first bottom source/drain in contact with a substrate and sidewalls of the first semiconductor fin; and a first bottom insulating layer in contact with the first bottom source/drain and sidewalls of the first semiconductor fin, wherein the second VTFET comprises a second bottom source/drain in contact with the at least one insulating layer and sidewalls of the second semiconductor fin; and a second bottom insulating layer in contact with the second bottom source/drain and sidewalls of the second semiconductor fin.

4. The semiconductor device structure of claim 3, wherein first VTFET further comprises a first gate structure in contact with the first bottom insulating layer and sidewalls of the first semiconductor fin; and a first top insulating layer in contact with the first gate structure and sidewalls of the first semiconductor fin, wherein the second VTFET comprises a second gate structure in contact with the second bottom insulating layer and sidewalls of the second semiconductor fin; and a second top insulating layer in contact with the second gate structure and sidewalls of the second semiconductor fin.

5. The semiconductor device structure of claim 4, wherein first VTFET further comprises a first top source/drain in contact with the first top insulating layer and the first semiconductor fin, wherein the second VTFET comprises a second top source/drain in contact with the second top insulating layer and the second semiconductor fin.

6. The semiconductor device structure of claim 5, wherein first VTFET further comprises a first encapsulation layer in contact with the first gate structure and first top insulating layer, wherein the second VTFET comprises a second encapsulation layer in contact with the second gate structure and second top insulating layer.

7. An integrated circuit comprising:

a stacked vertical transport field effect transistor (VTFET) device, wherein the stacked VTFET device comprises a first vertical transport field effect transistor (VTFET) comprising a first semiconductor fin;

a second VTFET stacked on the first VTFET and comprising a second semiconductor fin that is separate and distinct from the first semiconductor fin; and at least one insulating layer formed on a top surface of the first VTFET, wherein the second VTFET is formed on the at least one insulating layer, and wherein the first semiconductor fin is insulated from the second semiconductor fin by the at least one insulating layer.

8. The integrated circuit of claim 7, wherein the first VTFET and the second VTFET comprise one of a same doping type or a different doping type.

9. The integrated circuit of claim 7, wherein first VTFET comprises a first bottom source/drain in contact with a substrate and sidewalls of the first semiconductor fin; and a first bottom insulating layer in contact with the first bottom source/drain and sidewalls of the first semiconductor fin, wherein the second VTFET comprises a second bottom source/drain in contact with the at least one insulating layer and sidewalls of the second semiconductor fin; and a second bottom insulating layer in contact with the second bottom source/drain and sidewalls of the second semiconductor fin.

10. The integrated circuit of claim 9, wherein first VTFET further comprises a first gate structure in contact with the first bottom insulating layer and sidewalls of the first semiconductor fin; and a first top insulating layer in contact with the first gate structure and sidewalls of the first semiconductor fin, wherein the second VTFET comprises a second gate structure in contact with the second bottom insulating layer and sidewalls of the second semiconductor fin; and a second top insulating layer in contact with the second gate structure and sidewalls of the second semiconductor fin.

11. The integrated circuit of claim 10, wherein first VTFET further comprises a first top source/drain in contact with the first top insulating layer and the first semiconductor fin, wherein the second VTFET comprises a second top source/drain in contact with the second top insulating layer and the second semiconductor fin.

12. The integrated circuit of claim 11, wherein first VTFET further comprises a first encapsulation layer in contact with the first gate structure and first top insulating layer, wherein the second VTFET comprises a second encapsulation layer in contact with the second gate structure and second top insulating layer.

* * * * *